United States Patent [19]
Fujimoto

[11] Patent Number: 5,848,047
[45] Date of Patent: Dec. 8, 1998

[54] PLAYBACK APPARATUS AND PLAYBACK METHOD

[75] Inventor: Kensuke Fujimoto, Kanagawa, Japan

[73] Assignee: Sony Corporation, Tokyo, Japan

[21] Appl. No.: 887,519

[22] Filed: Jul. 3, 1997

[30] Foreign Application Priority Data

Jul. 15, 1996 [JP] Japan ................................. 8-184428

[51] Int. Cl.$^6$ .............................. G11B 7/00; H03L 7/08
[52] U.S. Cl. .............................. 369/124; 369/32; 369/54; 369/59
[58] Field of Search ................................. 369/59, 48, 51, 369/32, 54, 124

[56] References Cited

U.S. PATENT DOCUMENTS

| 4,672,597 | 6/1987 | Yamazaki .................................. 369/59 |
| 4,704,711 | 11/1987 | Gerard et al. ............................... 369/59 |
| 5,440,532 | 8/1995 | Yokogawa et al. ......................... 369/54 |

*Primary Examiner*—Tod R. Swann
*Assistant Examiner*—Kim-Kwok Chu
*Attorney, Agent, or Firm*—Limbach & Limbach L.L.P.

[57] ABSTRACT

An A/D converter supplies an interpolation circuit with sampled values which are obtained by sampling a playback signal coming from a read-out device in synchronization with a system clock signal. In the interpolation circuit, the value of the playback signal at the time the phase of a PLL clock phase signal P supplied by a PLL clockphase signal generator becomes zero is computed from the sampled values by using a linear interpolation technique. The interpolation value is then supplied to a binary conversion circuit and fed back to a phase error detecting circuit. The binary conversion circuit converts the interpolation value of the playback signal into a binary value which is then supplied to a circuit at the following stage. The phase error detecting circuit detects a zero cross of the interpolation value of the playback signal. The zero cross timing is then used for computing a phase error signal which is then output to the PLL clock phase signal generator by way of a loop filter. The PLL clock phase signal generator generates the PLL clock phase signal P which is supplied to the interpolation circuit as described above.

4 Claims, 12 Drawing Sheets

ZERO-CROSS ON A RISING EDGE

FIG. 8B

ZERO-CROSS ON A FALLING EDGE

PLAYBACK APPARATUS AND PLAYBACK METHOD

BACKGROUND OF THE INVENTION

In general, the present invention relates to a playback apparatus and a playback method. In particular, the invention relates to a playback apparatus and a playback method for generating a second clock signal in synchronization with a first clock signal by adjusting the clock frequency of the second clock signal in accordance with a phase error of an interpolation value and for computing the interpolation value at a predetermined phase of the second clock signal from values obtained as a result of sampling a predetermined signal (including the first clock signal) in synchronization with the first clock signal.

A compact disk, a representative recording medium for storing digital data, is becoming more and more popular in a wide range of applications.

When digital data is reproduced from such a recording medium like, for example, an optical disk or an opto magnetic disk, in most cases, a clock signal is extracted from a signal detected from the disk and digital data is then reproduced from the detected signal in synchronization with the extracted clock signal. Synchronization of extracting data from a signal with a clock signal extracted from the same signal is referred to as the so-called self synchronization.

In such self synchronization, the clock signal is extracted from the detected signal by using a PLL (Phase Locked Loop) circuit.

Figure 1:
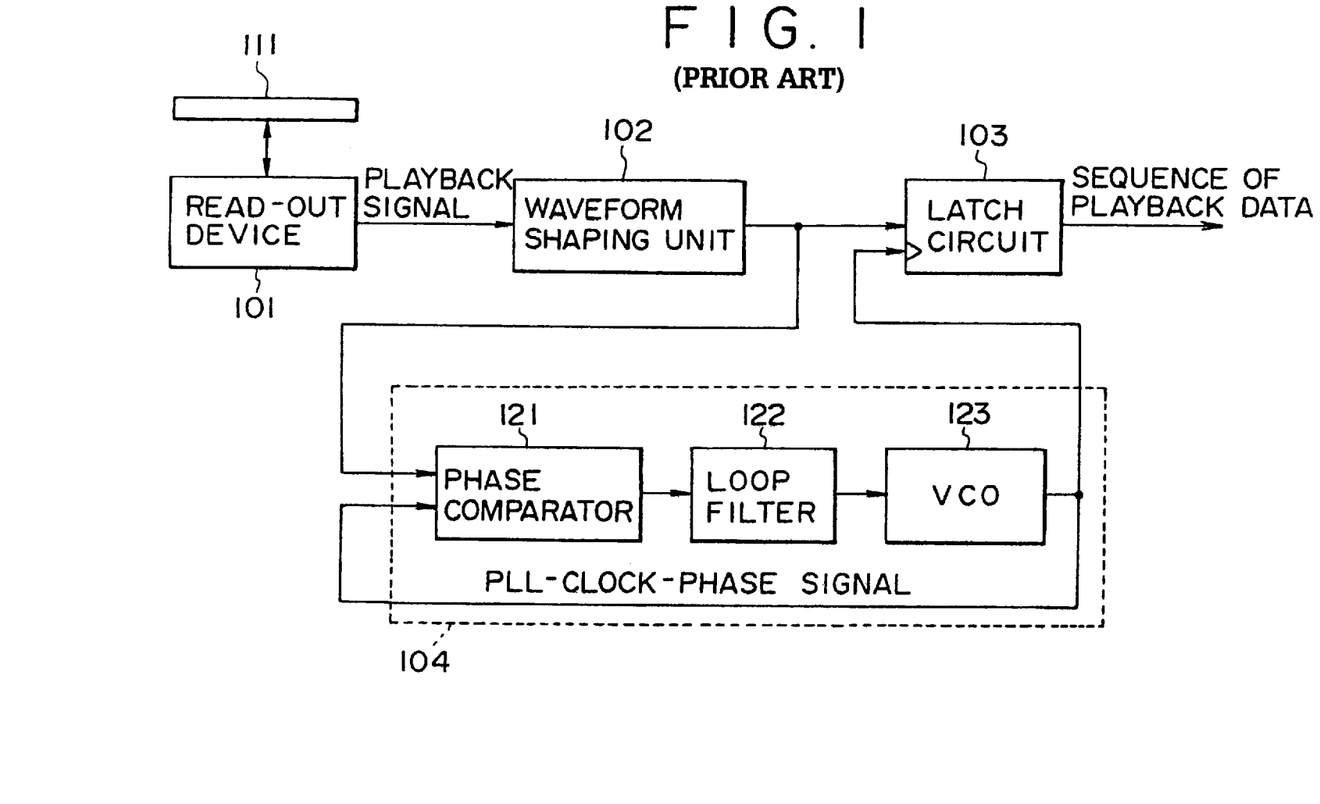
FIG. 1 is a diagram showing a typical configuration of the related art playback apparatus.

FIG. 1 is a diagram showing a typical configuration of the related art playback apparatus having an analog PLL circuit.

As shown in the figure, a read-out device 101 radiates a laser beam to an optical disk 111 such as a compact disk and receives a laser beam reflected by the optical disk 111, that is, a return light coming from the optical disk 111. An electrical signal representing the quantity of the incoming return light is then supplied by the read-out device 101 to a waveform shaping unit 102. The electrical signal is the so-called playback signal.

The waveform shaping unit 102 converts the playback signal supplied by the read-out device 101 into a binary signal and outputs the binary signal to a latch circuit 103 and an analog PLL circuit 104 as a playback signal.

The analog PLL circuit 104 extracts a clock signal from the playback signal supplied by the waveform shaping unit 102 and supplies the clock signal to the latch circuit 103. Values of the binary playback signal which are either 0 or 1 change at intervals each equal to a multiple of a predetermined bit period T. It should be noted that the intervals each correspond to a piece of data recorded on the optical disk 111. The analog PLL circuit 104 extracts the bit period T from the interval, generating a clock signal having a period corresponding to the bit period T.

In the analog PLL circuit 104, a phase comparator 121 computes a phase error between the playback signal supplied by the waveform shaping unit 102 and a clock signal (a PLL clock signal) oscillated by a voltage controlled oscillator (VCO) 123. The phase error is output by the phase comparator 121 to a loop filter 122 for eliminating high frequency components, that is, components in an unnecessary frequency band, from the phase error. The loop filter 122 outputs the processed phase error to the VCO 123.

In accordance with the voltage of a signal supplied from the loop filter 122, the VCO 123 oscillates the PLL clock signal while adjusting the frequency thereof so that the phase error with respect to the playback signal supplied by the waveform shaping unit 102 is eliminated. The PLL clock signal is fed back to the phase comparator 121 and supplied to the latch circuit 103.

In this way, the analog PLL circuit 104 generates the PLL clock signal synchronized with the playback signal.

The latch circuit 103 outputs the playback signal supplied by the waveform shaping circuit 102 in synchronization with the PLL clock signal oscillated by the analog PLL circuit 104 to a playback circuit at the following stage which is not shown in the figure.

However, the analog PLL circuit 104 has a problem that it is easily affected by changes in environment, changes with the lapse of time and component variations. There is also raised a problem that it is difficult to put the analog PLL circuit in a highly integrated circuit chip due to the fact that the PLL circuit is an analog circuit.

In order to solve the problem, a digital PLL circuit has been developed.

Figure 2:
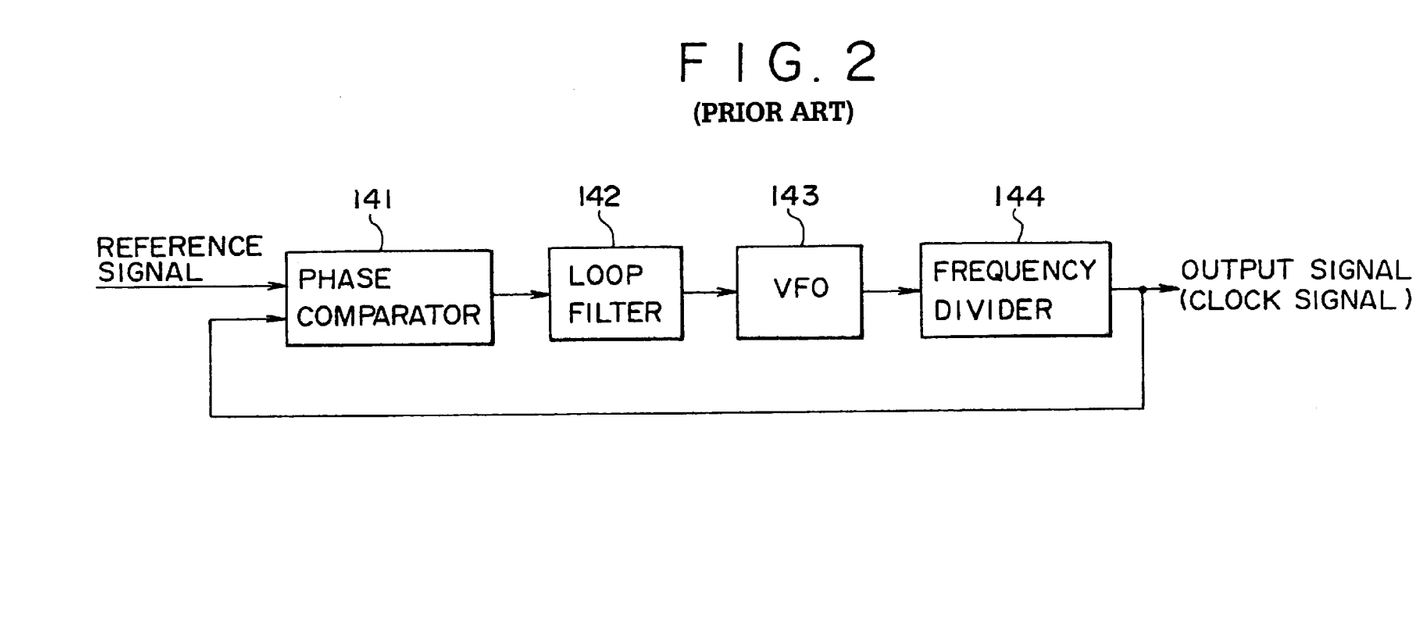
FIG. 2 is a diagram showing a typical configuration of a digital PLL circuit.

FIG. 2 is a diagram showing a typical configuration of a digital PLL circuit.

As shown in the figure, the digital PLL circuit comprises a digital phase comparator 141, a digital loop filter 142 and a variable frequency oscillator (VFO) 143 as a substitute for the VCO. The VFO 143 adjusts the frequency of an output signal thereof by adding or eliminating pulses to and from the output signal in accordance with the digital value of a phase error supplied by the digital phase comparator 141 to the VFO 143 by way of the digital loop filter 142. As an alternative, including two embedded oscillators with frequencies different from each other, the VFO 143 adjusts the frequency of an output signal thereof by switching the generation of the output signal from one embedded oscillator to the other embedded one in accordance with the digital value of a phase error supplied by the digital phase comparator 141 to the VFO 143 by way of the digital loop filter 142.

In order to adjust the oscillation frequency smoothly in accordance with phase error, the VFO 143 generates an interim output signal with a frequency equal to a multiple of the frequency of a finally desired clock signal by adjusting the frequency of the interim output signal. The VFO 143 supplies the interim output signal to a frequency divider 144 for dividing the frequency thereof. The output of the frequency divider 144 is the finally desired clock signal which is fed back to the digital phase comparator 141 and supplied to a circuit at the following stage which is not shown in the figure.

In an apparatus for processing data at a high speed or in an apparatus having a high transfer speed, by the way, the frequency of the clock signal is high. There is raised a problem, however, that it is difficult to implement a VFO which is capable of oscillating an interim output signal with a frequency equal to a multiple of the high frequency of the clock signal and that, even if such a VFO can be implemented, the cost thereof will be high.

As an conceivable alternative solution, the analog playback signal is converted by an A/D (analog to digital) converter into digital data which is then supplied a so-called computer for carrying out virtual PLL processing by software. In the case of this solution however, the speed of the software PLL processing is low, making it difficult to apply such a computer-based VFO to an apparatus that requires a high processing speed.

OBJECT AND SUMMARY OF THE INVENTION

The present invention addresses the problems described above. It is thus an object of the present invention to provide a playback apparatus capable of self-synchronizing a playback signal (including a first clock signal) by means of digital circuits for generating a second clock signal in synchronization with the first clock signal by adjusting the clock frequency of the second clock signal in accordance with a phase error of an interpolation value and for computing the interpolation value at a predetermined phase of the second clock signal from values obtained as a result of sampling the playback signal in synchronization with the first clock signal.

In order to achieve the object described above, the present invention provides a playback apparatus characterized by comprising an interpolation value computing unit for computing an interpolation value at a third point of time corresponding to a predetermined phase of a second clock signal from two values obtained by consecutively sampling a predetermined signal at a first point of time and a second point of time by linear interpolation.

In addition, the present invention also provides a playback method characterized by comprising the step of computing an interpolation value at a third point of time corresponding to a predetermined phase of a second clock signal from two values obtained by consecutively sampling a predetermined signal at a first point of time and a second point of time by linear interpolation based on a relation between the first, second and third points of time.

On the top of that, the present invention also provides a playback apparatus characterized by comprising a clock signal generating unit for computing a sum of a value of a second clock signal computed previously and a first constant and then:

either using the sum as a value of the second clock signal if the sum is equal to or smaller than a second constant; or     subtracting the second constant from the sum and using a subtraction result as a value of the second clock signal if the sum is greater than the second constant.

Furthermore, the present invention also provides a playback method characterized by comprising the steps of:

computing a sum of a value of a second clock signal computed previously and a first constant; and     either using the sum as a value of the second clock signal if the sum is equal to or smaller than a second constant; or     subtracting the second constant from the sum and using a subtraction result as a value of the second clock signal if the sum is greater than the second constant.

In the playback apparatus, the interpolation value computing unit computes an interpolation value at a third point of time corresponding to a predetermined phase of a second clock signal from two values obtained by consecutively sampling a predetermined signal at a first point of time and a second point of time by linear interpolation.

The playback method includes the step of computing an interpolation value at a third point of time corresponding to a predetermined phase of a second clock signal from two values obtained by consecutively sampling a predetermined signal at a first point of time and a second point of time by linear interpolation based on a relation between the first, second and third points of time.

In the playback apparatus, the clock signal generating unit computes a sum of a value of a second clock signal computed previously and a first constant and then:

either uses the sum as a value of the second clock signal if the sum is equal to or smaller than a second constant; or     subtracts the second constant from the sum and uses a subtraction result as a value of the second clock signal if the sum is greater than the second constant.

The playback method includes the steps of:

computing a sum of a value of a second clock signal computed previously and a first constant; and     either using the sum as a value of the second clock signal if the sum is equal to or smaller than a second constant; or     subtracting the second constant from the sum and using a subtraction result as a value of the second clock signal if the sum is greater than the second constant.

BRIEF DESCRIPTION OF THE DIAGRAMS

The embodiments of the present invention has been explained with reference to the following figures wherein.

DETAILED DESCRIPTION OF THE PREFERRED EMBODIMENTS

Figure 3:
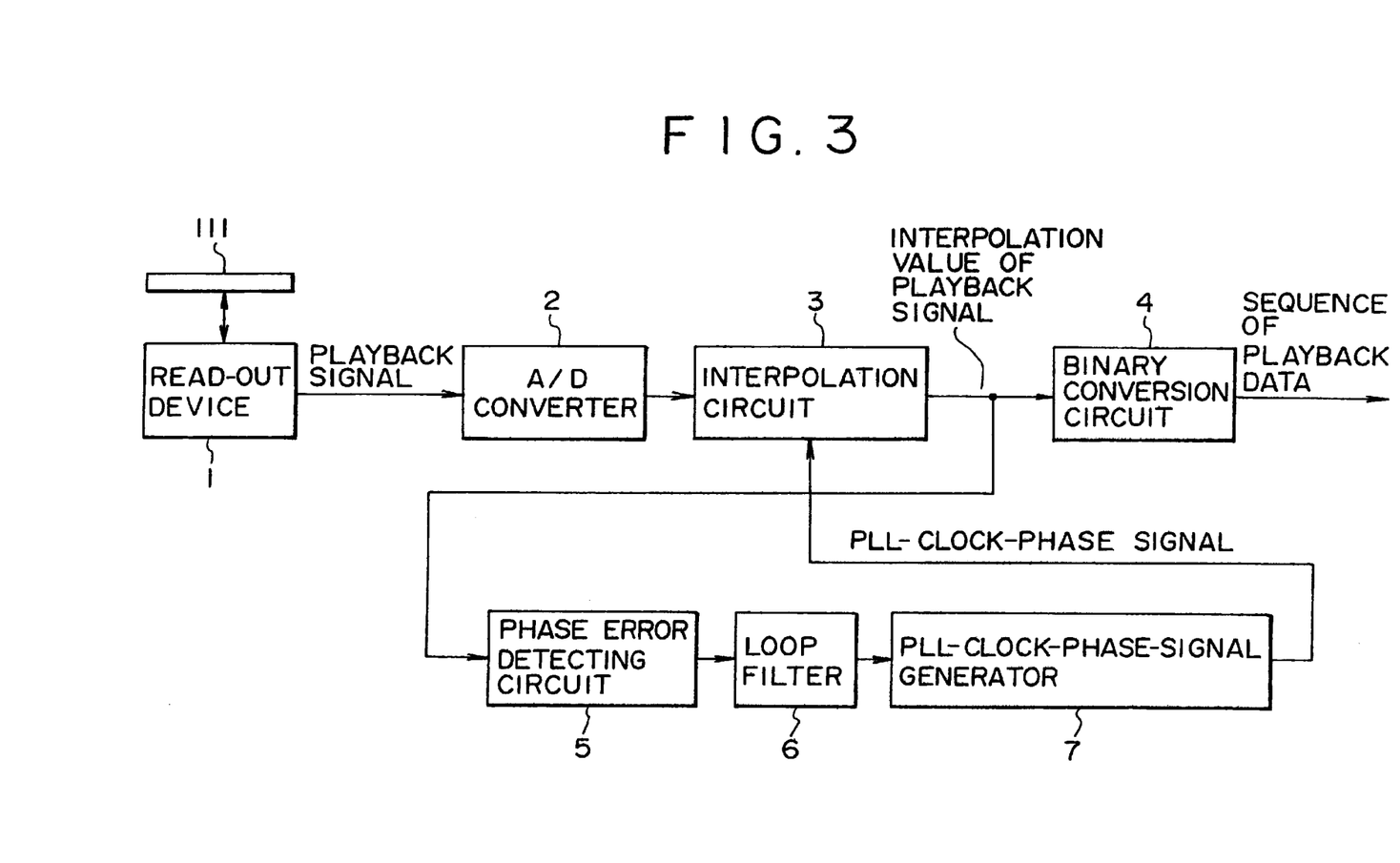
FIG. 3 is a diagram showing a typical configuration of an embodiment implementing a playback apparatus provided by the present invention.

The present invention will become more apparent from a study of the following detailed description of some preferred embodiments with reference to accompanying diagrams some of which show the embodiments. FIG. 3 is a diagram showing a typical configuration of an embodiment implementing a playback apparatus provided by the present invention.

As shown in the figure, a read-out device 1 radiates a laser beam to an optical disk 111 such as a compact disk and receives a laser beam reflected by the optical disk 111, that is, a return light coming from the optical disk 111. An electrical signal representing the quantity of the incoming return light, that is, a playback signal, is then supplied by the read-out device 1 to an A/D converter 2.

The A/D converter 2 supplies an interpolation circuit (or an interpolation value computing unit) 3 with sampled values, digital values each having a predetermined number of bits, which are obtained by sampling the playback signal coming from the read-out device 1 in synchronization with a system clock signal (which is also referred to as a first clock signal).

The interpolation circuit 3 operates in accordance with the system clock signal. To put it in detail, a PLL clock phase signal P (also referred to as a second clock signal) is supplied by a PLL clock phase signal generator (also referred to as a clock signal generator) 7 to the interpolation circuit 3 in synchronization with the system clock signal. A value (referred to as an interpolation value) of the playback signal at the time the phase of the PLL clock phase signal P becomes zero is computed from the sampled values supplied to the interpolation circuit 3 by the A/D converter 2 by using a linear interpolation technique. The interpolation value, digital data with a predetermined number of bits, is then supplied to a binary conversion circuit 4 and fed back to a phase error detecting circuit (also referred to as a phase error computing unit) 5.

Also operating in accordance with the system clock signal, the binary conversion circuit 4 converts the interpolation value of the playback signal supplied thereto by the interpolation circuit 3 into a binary value, that is, into 0 or 1. The binary value is then supplied to a circuit at the following stage which is not shown in the figure.

Also operating in accordance with the system clock signal, the phase error detecting circuit 5 detects a transition of the interpolation value of the playback signal supplied thereto by the interpolation circuit 3 from positive to negative or vice versa which is known as a zero cross. The zero cross timing is then used for generating a phase error signal which is then output to a loop filter 6.

Also operating in accordance with the system clock signal, the loop filter 6 passes on the phase error signal supplied by the phase error detecting circuit 5 to the PLL clock phase signal generator 7 after removing high frequency components from the phase error signal.

Also operating in accordance with the system clock signal, the PLL clock phase signal generator 7 generates the PLL clock phase signal P having a saw-tooth waveform (with the frequency thereof) determined by the phase error signal which is supplied by the loop filter 6 with the high frequency components thereof removed. The PLL clock phase signal P is supplied to the interpolation circuit 3 as described above.

Figure 4:
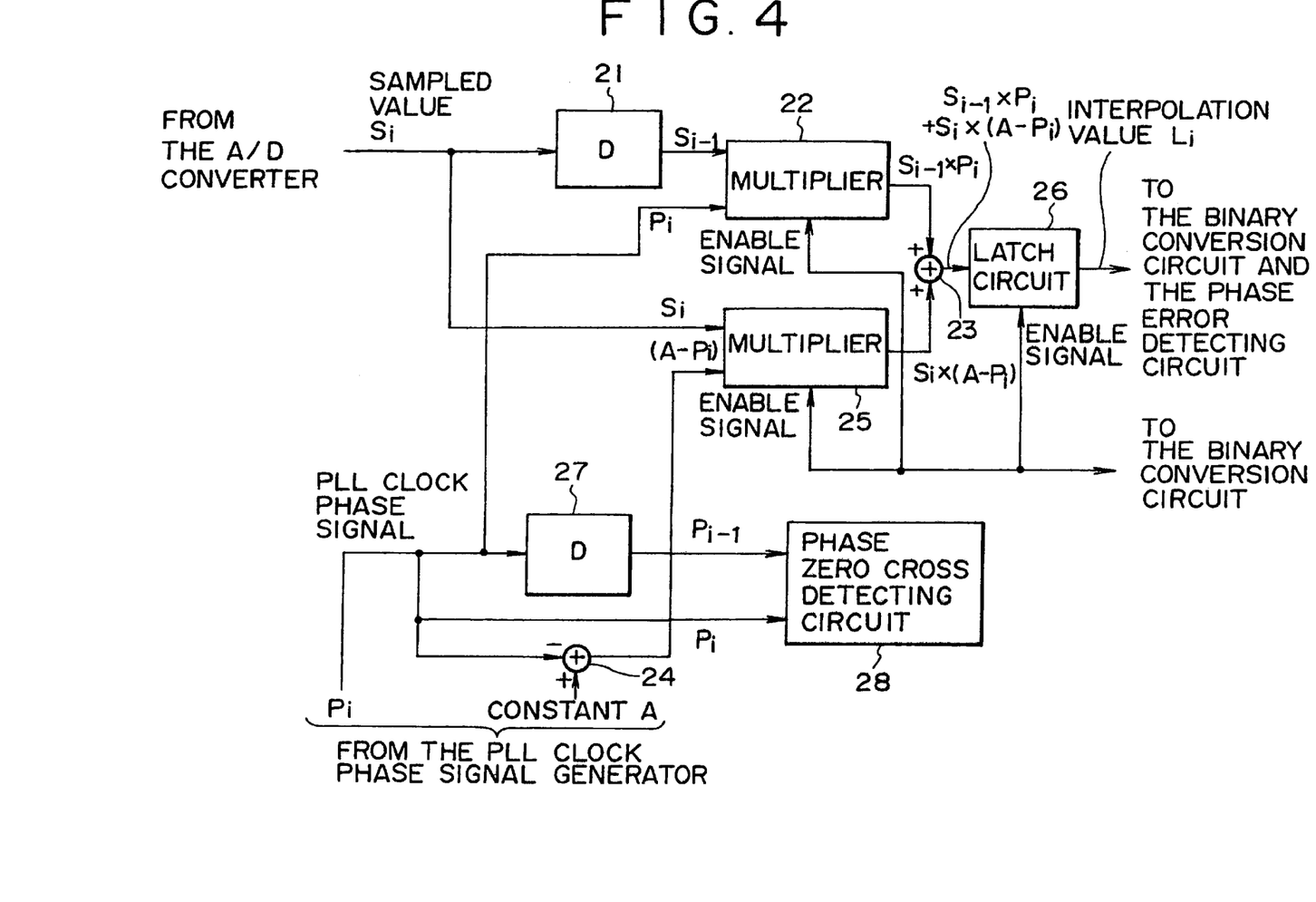
FIG. 4 is a diagram showing a typical configuration of an interpolation circuit 3 employed in the playback apparatus shown in FIG. 3.

FIG. 4 is a diagram showing a typical configuration of the interpolation circuit 3. As shown in the figure, the interpolation circuit 3 includes a delay device 21 for holding a sampled value $S_i$ resulting from sampling by the A/D converter 2 at a time $t_i$ till the next system clock and outputting the sampled value $S_i$ at the next clock to a multiplier 22.

When an enable signal is supplied to the multiplier 22 from a phase zero cross detecting circuit 28, the multiplier 22 computes the product $(S_{i-1} \times P_i)$ of a sampled value $S_{i-1}$ at a time $t_{i-1}$ supplied thereto by the delay device 21 and a value $P_i$ of the PLL clock phase signal P supplied by the PLL clock phase signal generator 7, outputting the product $(S_{i-1} \times P_i)$ to an adder 23. It should be noted that the time $t_{i-1}$ is a time earlier than the time $t_i$ by one system clock.

An adder (used as a subtractor) 24 computes the difference $(A-P_i)$ between the value $P_i$ of the PLL clock phase signal P supplied thereto by the PLL clock phase signal generator 7 and a constant A (also referred to as a first constant to be described later), outputting the difference $(A-P_i)$ to a multiplier 25.

When the enable signal is supplied to a multiplier 25 from the phase zero cross detecting circuit 28, the multiplier 25 computes the product $(S_i \times (A-P_i))$ of the sampled value $S_i$ resulting from sampling by the A/D converter 2 at the time $t_i$ and the difference $(A-P_i)$ supplied thereto by the adder 24, outputting the product $(S_i \times (A-P_i))$ to the adder 23.

The adder 23 computes the sum $(S_{i-1} \times P_i + S_i \times (A-P_i))$ of the product $(S_{i-1} \times P_i)$ supplied thereto by the multiplier 22 and the product $(S_i \times (A-P_i))$ supplied by the multiplier 25, outputting the sum $(S_{i-1} \times P_i + S_i \times (A-P_i))$ to a latch circuit 26.

A delay device 27 is used for holding a value $P_i$ of the PLL clock phase signal P generated by the PLL clock phase signal generator 7 at the time $t_i$ till the next system clock and outputting the value $P_i$ at the next clock to the phase zero cross detecting circuit 28.

The phase zero cross detecting circuit 28 computes the difference $(P_i - P_{i-i})$ between the value $P_{i-1}$ of the PLL clock phase signal P at the time $t_{i-1}$ supplied thereto by the delay device 27 and the value $P_i$ of the PLL clock phase signal P at the time $t_i$ supplied by the PLL clock phase signal generator 7, finding out whether the difference $(P_i - P_{i-1})$ is positive or negative. If the difference $(P_i - P_{i-1})$ is found negative, the phase zero cross detecting circuit 28 forms a judgment that a phase zero cross has occurred in the PLL clock phase signal P, that is, the phase of the PLL clock phase signal P once became zero at a point of time between the times $t_{i-1}$ and $t_i$. In this case, the enable signal is output to the multipliers 22 and 25 as well as the latch circuit 26.

The latch circuit 26 includes an embedded storage device. Receiving the enable signal from the phase zero cross detecting circuit 28, the latch circuit 26 updates a value stored in the storage device with a value supplied thereto from the adder 23 and, at the same time, outputs the value stored in the storage device to the binary conversion circuit 4 and feeds back the value to the phase error detecting circuit 5 as an interpolation value $L_i$.

Figure 5:
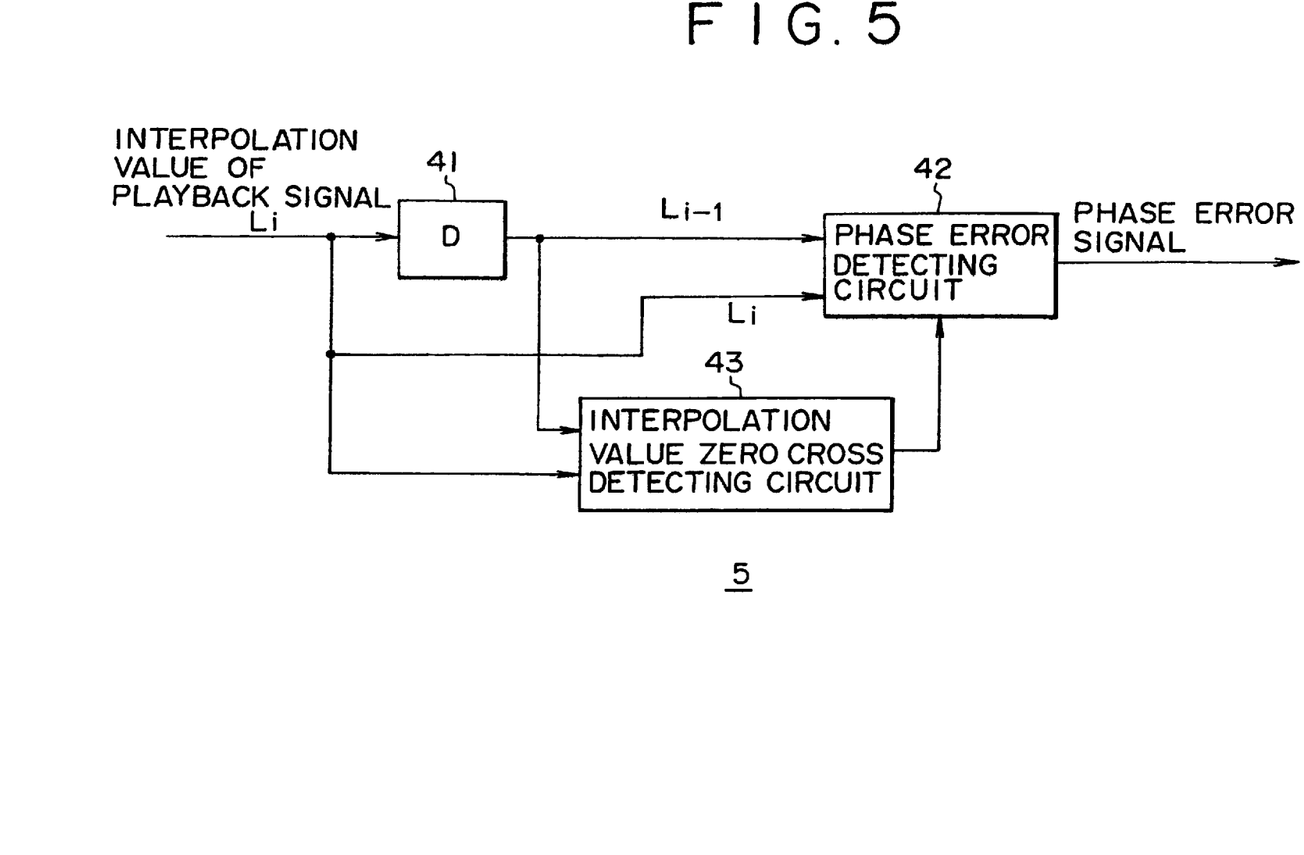
FIG. 5 is a diagram showing a typical configuration of a phase error detecting circuit 5 employed in the playback apparatus shown in FIG. 3.

FIG. 5 is a diagram showing a typical configuration of the phase error detecting circuit 5. As shown in the figure, the phase error detecting circuit 5 includes a delay device 41 for holding the interpolation value $L_i$ supplied by the interpolation circuit 3 for the period of a system clock and outputting the interpolation value $L_i$ at the next clock to a phase error computing circuit 42 and an interpolation value zero cross detecting circuit 43.

The interpolation value zero cross detecting circuit 43 forms a judgment as to whether or not a zero cross has occurred in the interpolation value of the playback signal from an interpolation value $L_{i-1}$ of the immediately preceding system clock supplied thereto by the delay device 41 and the interpolation value $L_i$ supplied by the interpolation circuit 3.

To put it in detail, the interpolation value zero cross detecting circuit 43 finds out whether or not the interpolation value $L_{i-1}$ is positive while the interpolation value $L_i$ is negative, or whether or not the interpolation value $L_{i-1}$ is negative while the interpolation value $L_i$ is positive. If the interpolation value $L_{i-1}$ is found positive while the interpolation value $L_i$ is found negative, the interpolation value zero cross detecting circuit 43 forms a judgment that an interpolation value zero cross has occurred on the falling edge of the interpolation value. In this case, a signal indicating such a falling edge zero cross is output to the phase error computing circuit 42. If the interpolation value $L_{i-1}$ is found negative while the interpolation value $L_i$ is found positive, on the other hand, the interpolation value zero cross detecting circuit 43 forms a judgment that an interpolation value zero cross has occurred on the rising edge of the interpolation value. In this case, a signal indicating such a rising edge zero cross is output to the phase error computing circuit 42.

In accordance with the signal supplied by the interpolation value zero cross detecting circuit 43, the phase error computing circuit 42 computes a phase error signal from the interpolation value $L_{i-1}$ of the immediately preceding system clock supplied thereto by the delay device 41 and the interpolation value $L_i$ supplied by the interpolation circuit 3, outputting the phase error signal to the loop filter 6.

To put it in detail, when a signal indicating a rising edge zero cross is received, the phase error computing circuit 42 computes the sum $(L_{i-1}+L_i)$ of the interpolation values $L_{i-1}$ and $L_i$ and outputs the sum $(L_{i-1}+L_i)$ to the loop filter 6 as a phase error signal.

When a signal indicating a falling edge zero cross is received, on the other hand, the phase error computing circuit 42 computes the sum $(L_{i-1}+L_i)$ of the interpolation values $L_{i-}$ and $L_i$ and multiplies the sum $(L_{i-1}+Li)$ by–1 to give a product $(-(L_{i-1}+L_i))$, outputting the product $(-(L_{i-1}+L_i))$ to the loop filter 6 as a phase error signal.

Figure 6:
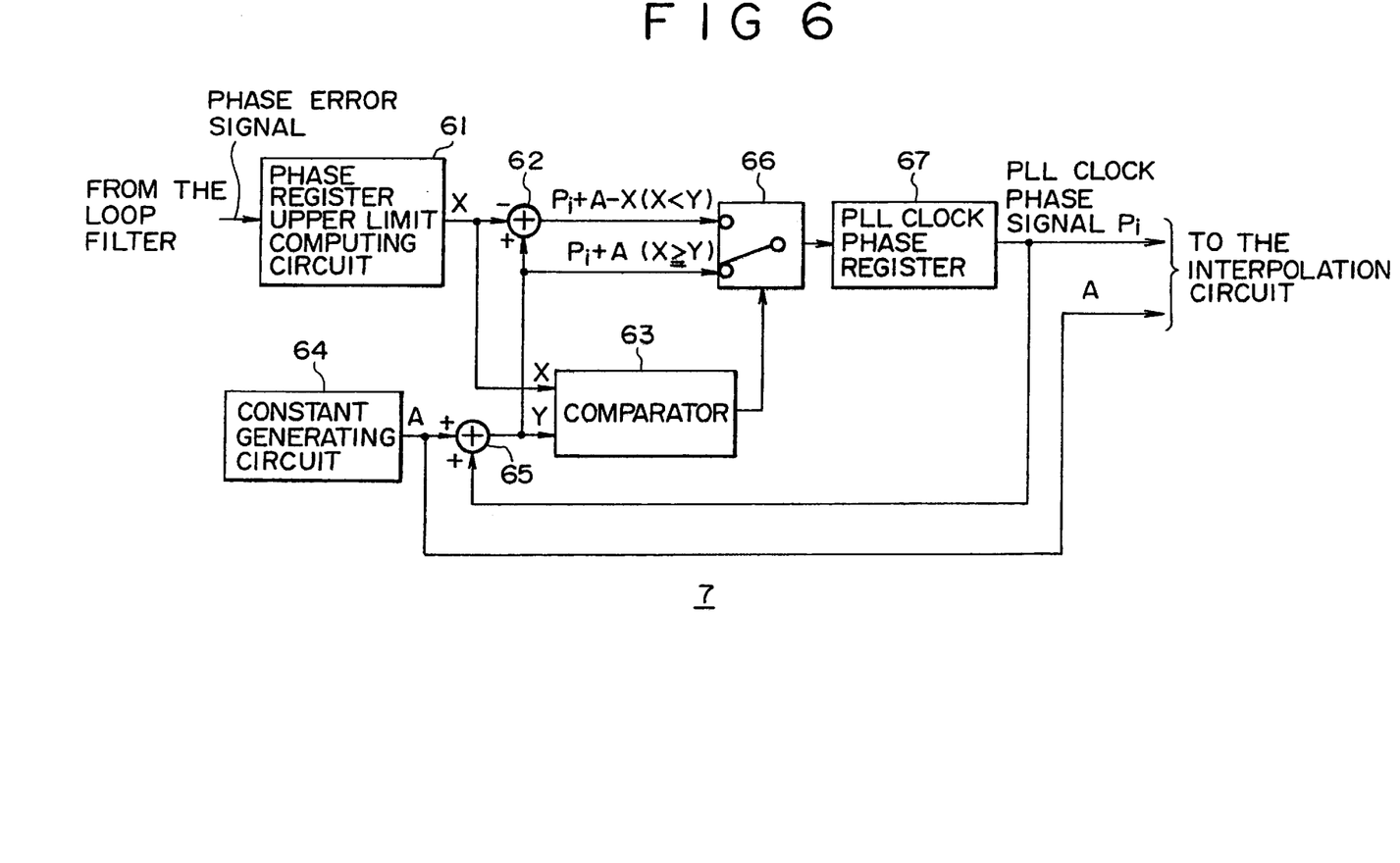
FIG. 6 is a diagram showing a typical configuration of the PLL clock phase signal generator 7 employed in the playback apparatus shown in FIG. 3.

FIG. 6 is a diagram showing a typical configuration of the PLL clock phase signal generator 7. As shown in the figure, the PLL clock phase signal generator 7 includes a phase register upper limit computing circuit 61, which also operates according to the system clock signal, for computing an upper limit value X (also referred to as a second constant) of a value held in a PLL clock phase register 67 in accordance with the value of the phase error signal supplied thereto by way of the loop filter 6. The upper limit value X is then output to an adder (used as a subtractor) 62 and a comparator 63.

A constant generating circuit 64 generates the constant A cited earlier to be supplied to an adder 65 and the interpolation circuit 3. As described before, the constant A is also referred to as a first constant.

The adder 65 computes the sum $(P_i+A)$ of the constant A supplied thereto by the constant generating circuit 64 and the PLL clock phase signal $P_i$ supplied by the PLL clock phase register 67, outputting the sum $(P_i+A)$ to the adder 62, the comparator 63 and a switch circuit 66.

The adder 62 computes the difference $(P_i+A-X)$ between the sum $(P_i+A)$ supplied thereto by the adder 65 and the upper limit value X supplied by the phase register upper limit computing circuit 61, outputting the difference $(P_i+A-X)$ to the switch circuit 66.

The comparator 63 compares the sum $(P_i+A)$ supplied thereto by the adder 65 with the upper limit value X supplied by the phase register upper limit computing circuit 61 by computing the difference $(P_i+A-X)$ between them.

The comparator 63 also finds out whether the computed difference $(P_i+A-X)$ is positive or negative. If the computed difference $(P_i+A-X)$ is found positive, that is, if $(P_i+A)>X$, a first control signal is supplied to the switch circuit 66. If the computed difference $(P_i+A-X)$ is found equal to or smaller than zero, that is, if $(P_i+A) \leq X$, on the other hand, a second control signal is supplied to the switch circuit 66.

Receiving the first control circuit indicating $(P_i+A)>X$, the switch circuit 66 passes on the difference $(P_i+A-X)$ supplied thereto by the adder 62 to the PLL clock phase register 67. If the second control circuit indicating $(P_i+A) \leq X$ is received, on the other hand, the switch circuit 66 forwards the sum $(P_i+A)$ supplied by the adder 65 to the PLL clock phase register 67.

Operating in accordance with the system clock signal, the PLL clock phase register 67 stores the difference $(P_i+A-X)$ or the sum $(P_i+A)$ supplied thereto by the switch circuit 66 in a storage device embedded therein and outputs the value $(P_i+A-X)$ or $(P_i+A)$ to the adder 65 and the interpolation circuit 3 shown in FIG. 1 as a value $P_i$ of the PLL clock phase signal P.

As described above, the PLL clock phase signal generator 7 operates in accordance with the system clock signal, adding the constant A to the value $P_i$ of the PLL clock phase signal P in every system clock. As the sum $(P_i+A)$ exceeds the upper limit value X, the upper limit value X is subtracted from the sum $(P_i+A)$ to result in the difference $(P_i+A-X)$.

Figure 7:
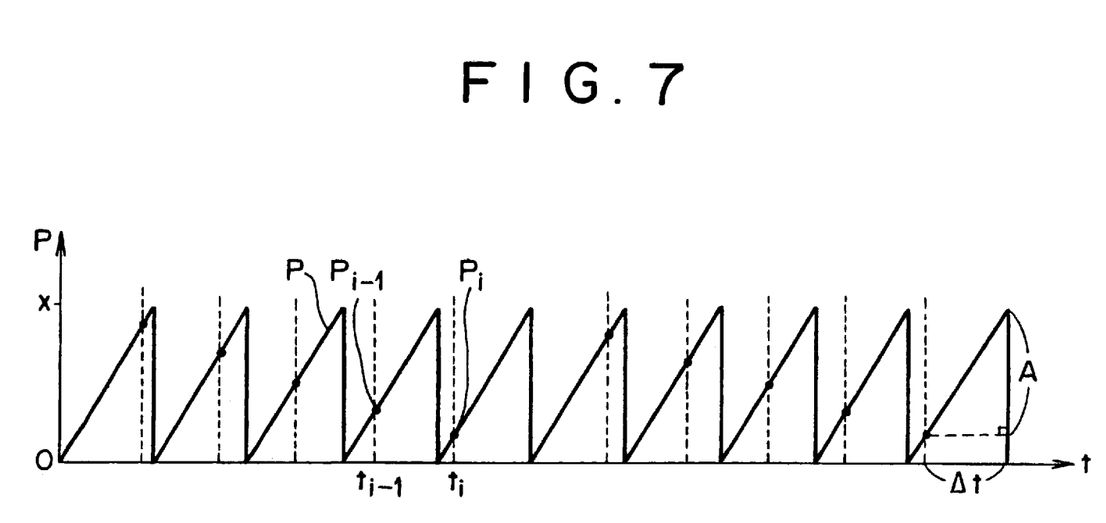
FIG. 7 is a diagram showing an example of a PLL clock phase signal P.

In this way, in each system clock, the PLL clock phase signal generator 7 derives the value $P_i$ of the PLL clock phase signal P having a saw-tooth waveform with a maximum amplitude equal to X, the first constant, and a slope $A/\Delta t$ where $\Delta t$ is the period of the system clock signal as shown in FIG. 7.

Next, the PLL operation of the embodiment is explained.

First of all, the interpolation value zero cross detecting circuit 43 employed in the phase error detecting circuit 5 receives the interpolation value $L_{i-1}$ of the playback signal for the immediately preceding system clock from the delay device 41 and the interpolation value $L_i$ for the present system clock from the interpolation circuit 3. The interpolation value zero cross detecting circuit 43 finds out whether or not the interpolation value $L_{i-1}$ is negative while the interpolation value $L_i$ is positive. If the interpolation value $L_{i-1}$ is found negative while the interpolation value $L_i$ is found positive, the interpolation value zero cross detecting circuit 43 forms a judgment that an interpolation value zero cross has occurred on the rising edge of the interpolation value. In this case, a signal indicating such a rising edge zero cross is output to the phase error computing circuit 42.

When a signal indicating a rising edge zero cross is received, the phase error computing circuit 42 computes the sum $(L_{i-1}+L_i)$ of the interpolation value $L_{i-1}$ of the immediately preceding system clock and the current interpolation value $L_i$ and outputs the sum $(L_{i-1}+L_i)$ to the loop filter 6 as a phase error signal.

Figure 8A:
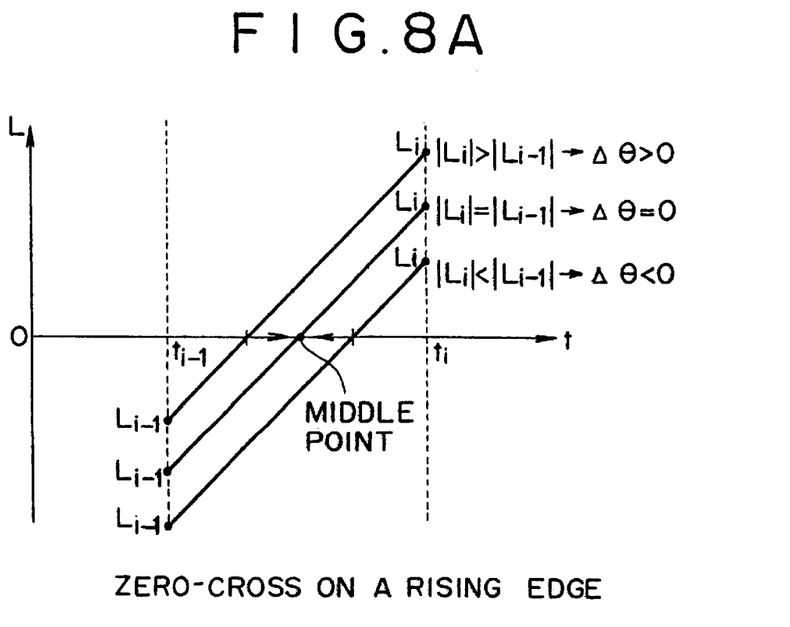
FIGS. 8A and 8B are diagrams showing relations between the interpolation values $L_{i-1}$ and $L_i$ of a playback signal and the value of a phase error signal $\Delta\theta$.

FIG. 8A shows relations between the interpolation values $L_{i-1}$ and $L_i$ at the time the rising edge zero cross is detected and the value of the phase error signal $\Delta\theta$. If the absolute value of the interpolation value $L_i$ is greater than the absolute value of the interpolation value $L_{i-1}$, the value of the phase error signal $\Delta\theta$ is positive. If the absolute value of the interpolation value $L_i$ is smaller than the absolute value of the interpolation value $L_{i-1}$, on the other hand, the value of the phase error signal $\Delta\theta$ is negative.

By the same token, the interpolation value zero cross detecting circuit 43 finds out whether or not the interpolation value $L_{i-1}$ is positive while the interpolation value $L_i$ is negative. If the interpolation value $L_{i-1}$ is found positive while the interpolation value $L_i$ is found negative, the interpolation value zero cross detecting circuit 43 forms a judgment that a interpolation value zero cross has occurred on the falling edge of the interpolation value. In this case, a signal indicating such a falling edge zero cross is output to the phase error computing circuit 42.

When a signal indicating a falling edge zero cross is received, the phase error computing circuit 42 computes the sum $(L_{i-1}+L_i)$ of the interpolation value $L_{i-1}$ of the immediately preceding system clock and the current interpolation value $L_i$ and multiplies the sum $(L_{i-1}+L_i)$ by −1 to give a product $(-(L_{i-1}))$, outputting the product $(-(L_{i-1}+L_i))$ to the loop filter 6 as a phase error signal.

Figure 8B:
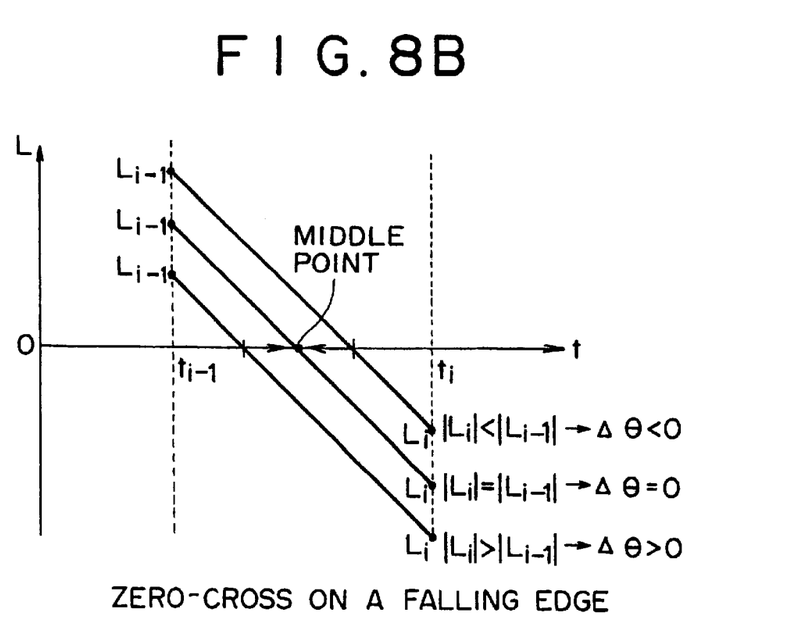

FIG. 8B shows relations between the interpolation values $L_{i-1}$ and $L_i$ at the time the falling edge zero cross is detected and the value of the phase error signal $\Delta\theta$. If the absolute value of the interpolation value $L_i$ is greater than the absolute value of the interpolation value $L_{i-1}$, the value of the phase error signal $\Delta\theta$ is positive. If the absolute value of the interpolation value $L_i$ is smaller than the absolute value of the interpolation value $L_{i-1}$, on the other hand, the value of the phase error signal $\Delta\theta$ is negative.

It should be noted that the interpolation value $L_i$ and the interpolation value $L_{i-1}$ having the same sign indicate that an interpolation value zero cross did not occur. In this case, the interpolation value zero cross detecting circuit 43 does not output any signal to the phase error computing circuit 42 in particular. When the interpolation value zero cross detecting circuit 43 does not supply a signal indicating an interpolation value zero cross to the phase error computing circuit 42, the phase error computing circuit 42 outputs a zero to the loop filter 6 as a phase error signal.

Let an interpolation value L be obtained by applying a linear interpolation technique to the interpolation value $L_{i-1}$ at the time $t_{i-1}$ and the interpolation value $L_i$ at the time $t_i$. The value L becomes zero at a time $t_o$ earlier or later than a middle point between the times $t_{i-1}$ and $t_i$. As shown in FIGS. 8A and 8B, if the time $t_o$ is earlier than the middle point between the times $t_{i-1}$ and $t_i$, a positive phase error signal is supplied to the loop filter 6 be the interpolation value zero cross a rising edge zero cross or a falling edge zero cross. If the time $t_o$ is later than the middle point between the times $t_{i-1}$ and $t_i$, on the other hand, a negative phase error signal is supplied to the loop filter 6 regardless of whether the interpolation value zero cross is a rising edge interpolation value zero cross or a falling edge interpolation value zero cross.

It is obvious from FIG. 3 that the PLL clock phase signal P generated by the PLL clock phase signal generator 7 is not supplied directly to the phase error detecting circuit 5. Instead, the PLL clock phase signal P generated by the PLL clockphase signal generator 7 is supplied indirectly to the phase error detecting circuit 5 by way of the interpolation circuit 3. It should be noted, however, that if a phase zero cross does not occur in the PLL clock phase signal, the interpolation value of the playback signal supplied from the interpolation circuit 3 to the phase error detecting circuit 5 is not updated by the interpolation circuit 3. In this case, the phase error detecting circuit 5 outputs a zero to the loop filter 6 as a phase error signal because the interpolation value $L_i$ and the interpolation value $L_{i-1}$ have the same sign as described above, indirectly reflecting the state of the PLL clock phase signal P in the operation thereof.

Then, the loop filter 6 outputs the phase error signal to the PLL clock phase signal generator 7 after eliminating high frequency components from the phase error signal. In this way, the loop filter 6 prevents a positive feedback with a much lagging phase in the high frequency zone in the PLL operation and, at the same time, reduces the number of intersymbol interference components and the amount of noise included in the playback signal.

Subsequently, the phase register upper limit computing circuit 61 employed in the PLL clock phase signal generator 7 computes an upper limit value X of a value held in the PLL clock phase register 67 in accordance with the value of the phase error signal supplied thereto by the phase error detecting circuit 5 by way of the loop filter 6. The upper limit value X is then output to the adder 62 (used as a subtractor) and the comparator 63.

The comparator 63 compares the sum $(P_i+A)$ supplied thereto by the adder 65 with the upper limit value X supplied by the phase register upper limit computing circuit 61 by computing the difference $(P_i+A-X)$ between them. Then, the comparator 63 finds out whether the computed difference $(P_i+A-X)$ is positive or negative. If the computed difference $(P_i+A-X)$ is found positive, that is, if $(P_i+A)>X$, a first control signal is supplied by the comparator 63 to the switch circuit 66. Receiving the first control circuit indicating $(P_i+A)>X$, the switch circuit 66 passes on the difference $(P_i+A-X)$ supplied thereto by the adder 62 to the PLL clock phase register 67.

If the computed difference $(P_i+A-X)$ is found equal to or smaller than zero, that is, if $(P_i+A)\leq X$, on the other hand, a second control signal is supplied by the comparator 63 to the switch circuit 66. Receiving the second control circuit indicating $(P_i+A)\leq X$, the switch circuit 66 forwards the sum $(P_i+A)$ supplied by the adder 65 to the PLL clock phase register 67.

The PLL clock phase register 67 stores the difference $(P_i+A-X)$ or the sum $(P_i+A)$ supplied thereto by the switch circuit 66 in a storage device embedded therein and outputs the value $(P_i+A-X)$ or $(P_i+A)$ to the interpolation circuit 3 as a value $P_i$ of the PLL clock phase signal P.

In this way, the PLL clock phase signal generator 7 in each system clock derives the value $P_i$ of the PLL clock phase signal P having a saw-tooth waveform like the one shown in FIG. 7 and outputs the value $P_i$ to the interpolation circuit 3. At the same time, the PLL clock phase signal generator 7 adjusts the frequency of the PLL clock phase signal P having a virtual saw-tooth waveform by adjusting the upper limit value X in accordance with the phase error signal.

Then, the interpolation circuit 3 detects a time (referred to as a third point of time) at which the phase of the virtual PLL clock phase signal P is zero from two consecutive values $P_{i-1}$ and $P_i$ of the PLL clock phase signal P at the times $t_{i-1}$ (referred to as a first point of time) and $t_i$ (referred to as a second point of time) respectively. It should be noted that, at the third point of time, the phase of the PLL clock phase signal (strictly speaking, the value of the virtual PLL clock phase signal P) is zero, that is, a phase zero cross occurs. The value of the playback signal at the time the phase zero cross occurs is then calculated by the interpolation circuit 3 by using the linear interpolation technique from sampled values $S_{i-1}$ and $S_i$ supplied thereto by the A/D converter 2.

Figure 9:
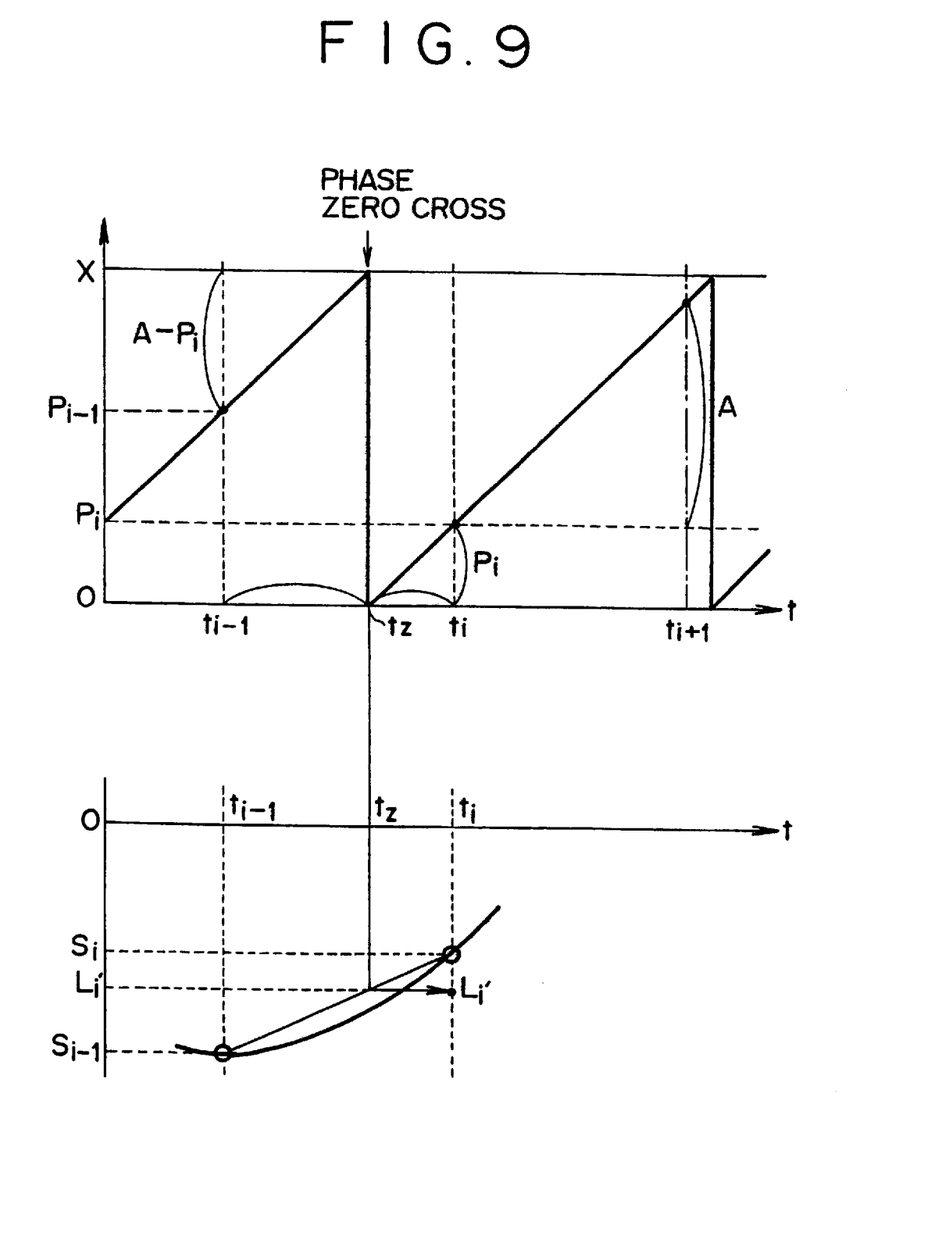
FIG. 9 is an explanatory diagram showing how an interpolation value of a playback signal is found.

Let $t_z$ be the time at which a phase zero cross occurs in the virtual PLL clock phase signal P. Since the slope of the saw-tooth waveform of the PLL clock phase signal P is fixed as shown in FIG. 9, the ratio of $(t_i-t_z)$ to $(t_z-t_{i-1})$ is equal to the ratio of $P_i$ to $(A-P_i)$ or $((t_i-t_z):(t_z-t_{i-1}))$ is equal to $(P_i:(A-P_i))$.

In addition, since an interpolation value $L_i'$ is calculated from the sampled values $S_{i-1}$ and $S_i$ using the linear interpolation technique, the ratio of $(t_i-t_z)$ to $(t_z-t_{i-1})$ is equal to the ratio of $(S_i-L_i')$ to $(L_i'-S_{i-1})$ or $((t_i-t_z):(t_z-t_{i-1}))$ is equal to $((S_i-L_{i-1}'):(L_i-S_{i-1}))$.

Accordingly, the ratio of $(S_i-L_i')$ to $(L_i'-S_{i-1})$ is equal to the ratio of $P_i$ to $(A-P_i)$ or $((S_i-L_i'):(L_i-S_{i-1}))$ is equal to $(P_i:(A-P_i))$. The following equation thus holds true:

$$(S_i-L_i')/(L_i'-S_{i-1})=P_i/(A-P_i)$$

Rewriting the above equation results in an equation expressing the interpolation value $L_i'$ of the playback signal as follows.

$$L_i' = (S_{i-1} \times P_i + S_i \times (A - P_i))/A$$

The numerator $(S_{i-1} \times P_i + S_i \times (A - P_i))$ of the ratio on the right hand side of the above equation is calculated by using the delay device 21, the multiplier 22, the adder 23, the adder 24 and the multiplier 25 employed in the interpolation circuit 3.

First of all, the phase zero cross detecting circuit 28 computes the difference $(P_i - P_{i-1})$ between the value $P_{i-1}$ of the PLL clock phase signal P at the time $t_{i-1}$, a point of time ahead of the present time ti by one system clock, supplied thereto by the delay device 27 and the value $P_i$ of the PLL clock phase signal P at the present time $t_i$ supplied by the PLL clock phase signal generator 7, finding out whether the difference $(P_i - P_{i-1})$ is positive or negative. If the difference $(P_i - P_{i-1})$ is found negative, the phase zero cross detecting circuit 28 forms a judgment that a phase zero cross has occurred in the PLL clock phase signal P, that is, the phase of the PLL clock phase signal P once became zero at a point of time between the times $t_{-1}$ and $t_i$. In this case, the enable signal is output to the multipliers 22 and 25 as well as the latch circuit 26.

When an enable signal is supplied to the multiplier 22 from the phase zero cross detecting circuit 28, the multiplier 22 computes the product $(S_{i-1} \times P_i)$ of a sampled value $S_{i-1}$ at a time $t_{i-1}$ supplied thereto by the delay device 21 and a value $P_i$ of the PLL clock phase signal P supplied by the PLL clock phase signal generator 7, outputting the product $(S_{i-1} \times P_i)$ to the adder 23. On the other hand, the multiplier 25 computes the product $(S_i \times (A - P_i))$ of a sampled value Si at a time $t_i$ supplied the by the A/D converter 2 and the difference $(A - P_i)$ supplied by the adder 24, outputting the product $(S_i \times (A - P_i))$ to the adder 23.

The adder 23 computes the sum $(S_{i-1} \times P_i + S_i \times (A - P_i))$ of the product $(S_{i-1} \times P_i)$ supplied thereto by the multiplier 22 and the product $(S_i \times (A - P_i))$ supplied by the multiplier 25, outputting the sum $(S_{i-1} \times P_i + S_i \times (A - P_i))$ to a latch circuit 26.

Receiving the enable signal from the phase zero cross detecting circuit 28, the latch circuit 26 updates a value stored in the storage device with a value supplied thereto from the adder 23 and, at the same time, outputs the value stored in the storage device to the binary conversion circuit 4 and feeds back the value to the phase error detecting circuit 5 as an interpolation value $L_i$.

Figure 10:
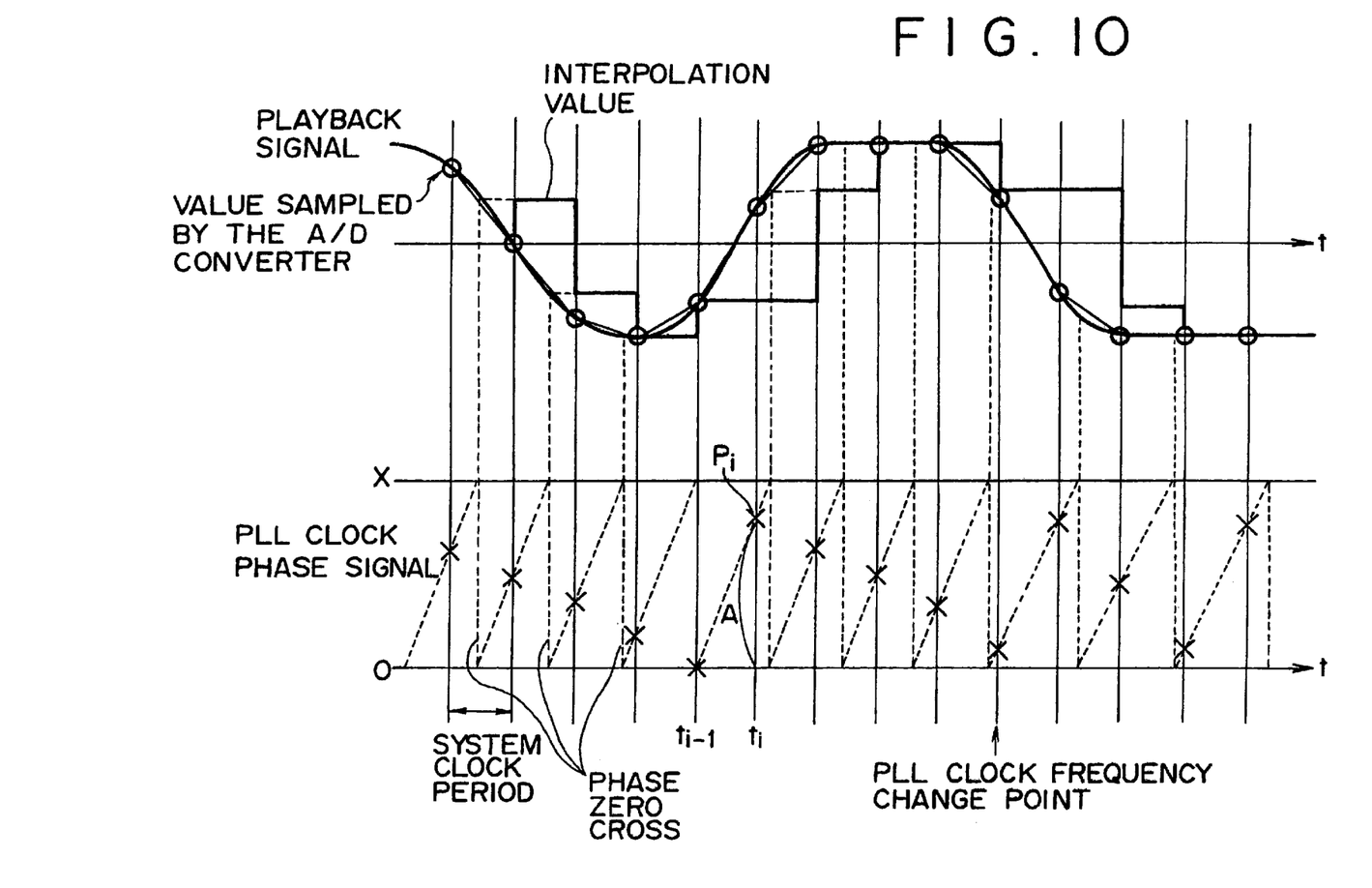
FIG. 10 is a diagram showing an example of the playback signal.

FIG. 10 is a diagram showing an example of the interpolation value $L_i$ output by the latch circuit 26. If the difference $(P_i - P_{i-1})$ between the value $P_i$ of the PLL clock phase signal P at the time $t_{i-1}$ supplied by the delay device 27 and the value $P_i$ (denoted by an X mark) of the PLL clock phase signal P at the present time $t_i$ supplied by the PLL clock phase signal generator 7 indicates that a phase zero cross has occurred in the PLL clock phase signal P at a point of time between the times $t_{i-1}$ and $t_i$, the interpolation circuit 3 updates the interpolation value. If a phase zero cross did not occur in the PLL clock phase signal P at a point of time between the times $t_{i-1}$ and $t_i$, on the other hand, the interpolation circuit 3 does not update the interpolation value.

The interpolation circuit 3 computes the value of the expression $(S_{i-1} \times P_i + S_i \times (A - P_i))$ as an interpolation value $L_i$ (that is, $L_i = (S_{i-1} \times P_i + S_i \times (A - P_i))$) and outputs the interpolation value $L_i$ to the binary conversion circuit 4 at the following stage and feeds back it to the phase error detecting circuit 5. Then, the binary conversion circuit 4 computes the finally desired interpolation value $L_i'$ which is equal to $L_i/A$ by bit shifting the interpolation value $L_i$ by as many bits as required to divide the interpolation value $L_i$ by the constant A.

In this way, no processing circuit is required for carrying out the division of the interpolation value $L_i$ by the constant A, allowing the cost to be reduced.

It should be noted that, if a phase zero cross does not occur in the PLL clock phase signal P, the enable signal is not output to the multipliers 22 and 25 and the latch circuit 26. In his case, the latch circuit 26 outputs the interpolation value of the immediately preceding system clock as it is. Since the binary conversion circuit 4 carries out processing in synchronization with the enable signal generated by the phase zero cross detecting circuit 28, the interpolation value of the immediately preceding system clock output as it is by the latch circuit 26 is not processed by the binary conversion circuit 4 for the second time, that is, the same interpolation value of two consecutive system clocks is not processed twice.

As described above, in the present invention, the phase error detecting circuit 5 detects a phase error, that is a deviation of a zero cross of the interpolation value occurring in the playback signal from a middle point of two consecutive system clocks. The PLL clock phase clock signal generator 7 uses the deviation to adjust the frequency of the virtual PLL clock phase signal P in order to adjust the timing for calculating an interpolation value, that is, the time at which the phase of the PLL clock phase signal P becomes zero. In this way, the interpolation value zero cross of the interpolation value occurring in the playback signal can be brought to a point of time closer to the middle point.

By bringing the zero cross of the interpolation value occurring in the playback signal to a point of time closer to the middle point, the binary conversion circuit 4 can carry out binary conversion processing with a high degree accuracy even if the zero cross of the interpolation value occurring in the playback signal deviates from the middle point to a certain degree due to intersymbol interference and noise.

It should be noted that, in the present embodiment, all circuits composing the PLL such as the interpolation circuit 3 each operate in synchronization with the system clock signal. As a result, a circuit operating at a clock frequency higher than that of the system clock signal is not required even if high speed processing is to be carried out, allowing a low cost playback apparatus to be implemented.

The following is description of another embodiment implementing a playback apparatus provided by the present invention.

The present embodiment is obtained by modifying the interpolation circuit 3 and the PLL clock phase signal generator 7 employed in the previous embodiment described above. For this reason, only the interpolation circuit 3 and the PLL clock phase signal generator 7 are explained, omitting the description of the other components.

Figure 11:
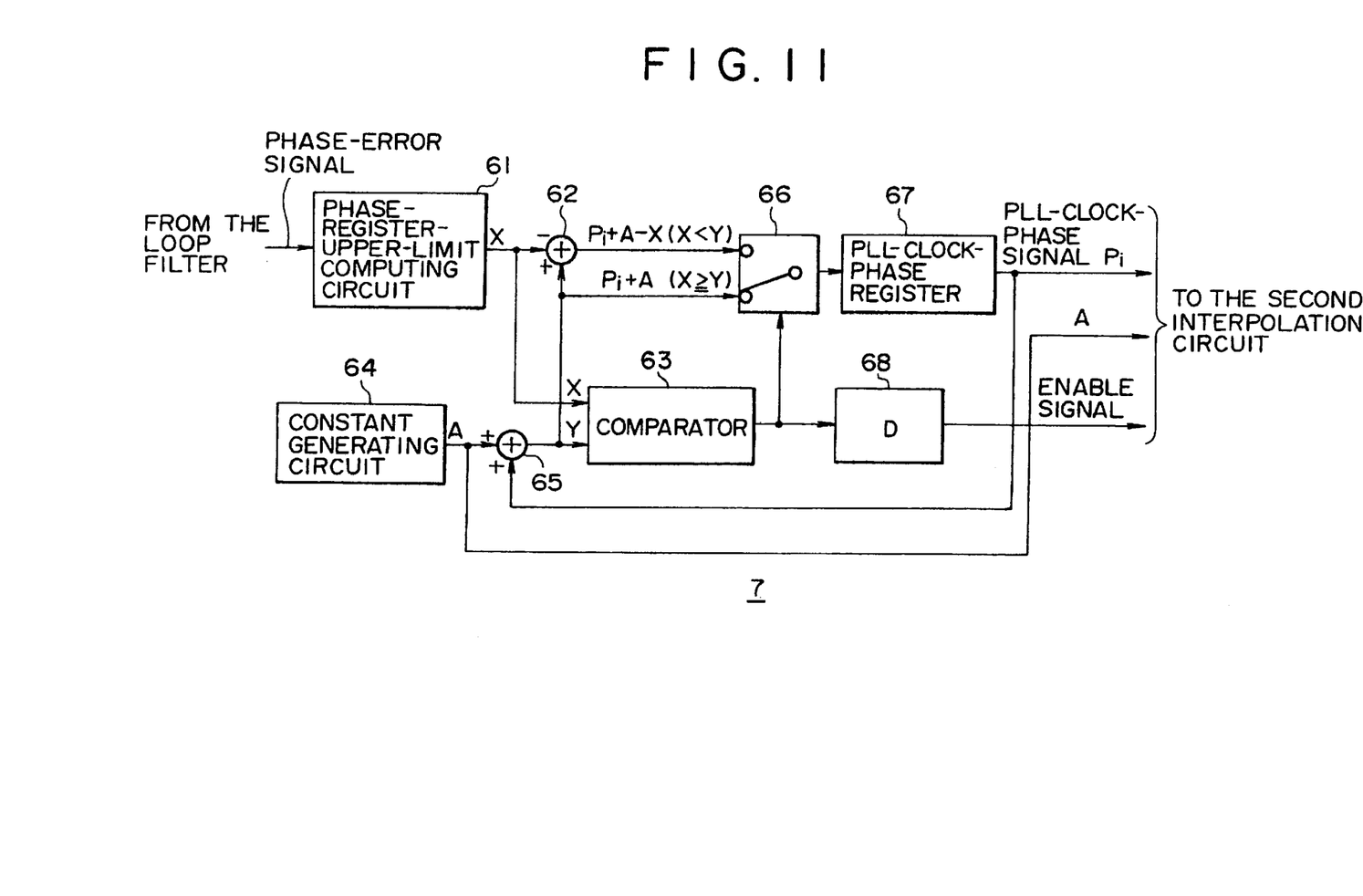
FIG. 11 is a diagram showing a typical configuration of a PLL clock phase signal generator 7 employed in another present embodiment.

FIG. 11 is a diagram showing a typical configuration of the PLL clock phase signal generator 7 employed in the present embodiment. As shown in the figure, the PLL clock phase signal generator 7 has a delay device 68 for holding the output of the comparator 63 for one period of the system clock signal before supplying the output to the interpolation circuit 3 and the binary conversion circuit 4 as an enable signal. This is because, when a phase zero cross occurs in the PLL clock phase signal P between the times $t_{i-1}$ and $t_i$, the comparator 63 will detect the fact that the sum $(P_i + A)$ at the time $t_i$ is greater than the upper limit value X, thus, the output of the comparator 63 can be used as an enable signal of the previous embodiment described earlier.

It should be noted that the other elements composing the configuration of the PLL clock phase signal generator 7 are the same as those employed in the previous embodiment described earlier, making it unnecessary to repeat their explanation.

Figure 12:
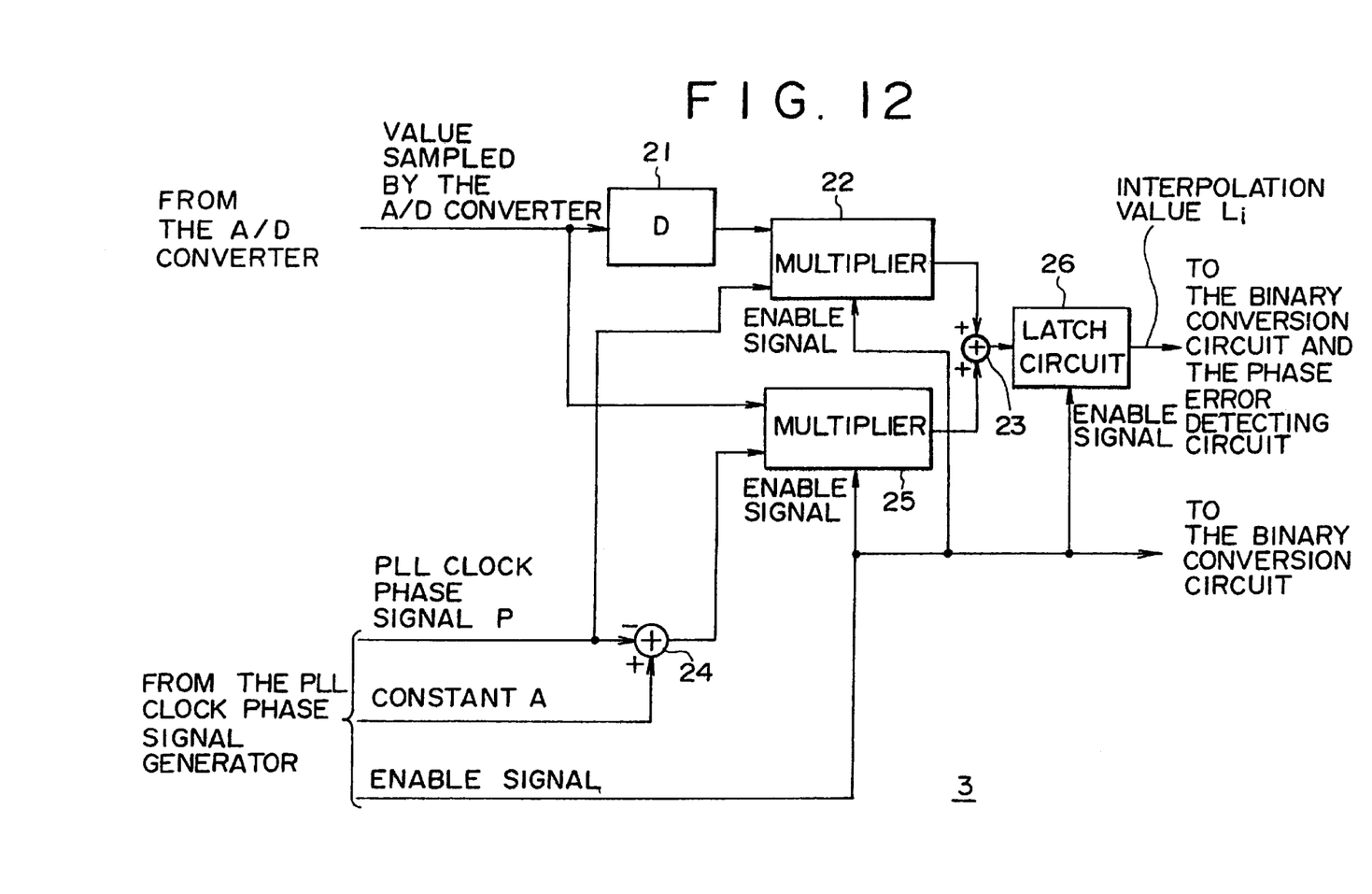
FIG. 12 is a diagram showing a typical configuration of an interpolation circuit 3 employed in the other embodiment.

FIG. 12 is a diagram showing a typical configuration of the interpolation circuit 3 employed in the present embodiment. In the case of the present interpolation circuit 3, in place of the enable signal generated by the delay device 27 and the phase zero cross detecting circuit 28 employed in the interpolation circuit 3 of the previous embodiment, the enable signal generated by the PLL clock phase signal generator 7 is used, making it unnecessary to employ the delay device 27 and the phase zero cross detecting circuit 28 in the present interpolation circuit 3.

It should be noted that the other elements composing the configuration of the interpolation circuit 3 are the same as those employed in the previous embodiment described earlier, making it unnecessary to repeat their explanation.

As described above, even though the delay device 68 is employed in the PLL clock phase signal generator 7, it is not necessary to provide the delay device 27 and phase zero cross detecting circuit 28 in the present interpolation circuit 3. As a result, the number of components required by the playback apparatus implemented by the present embodiment can be reduced, allowing the circuit to be made simpler.

As described above, the phase error detecting circuit 5 employed in the embodiments calculates a phase error from interpolation values, which are each obtained by using a linear interpolation technique, at a time of the occurrence of a zero cross of the interpolation values. It should be noted, however, that interpolation values obtained by using a high order interpolation technique can also be used for computing a phase error at a time of the occurrence of a zero cross of the interpolation values.

What is claimed is:

1. A playback apparatus comprising:

an interpolation value computing unit for computing an interpolation value of a predetermined signal at a predetermined phase of a second clock signal from values obtained by sampling said predetermined signal in synchronization with a first clock signal;

a phase error computing unit for computing a phase error of said interpolation value; and a clock signal generating unit for generating said second clock signal by adjusting the clock frequency thereof in accordance with said phase error, said playback apparatus characterized in that said interpolation value computing unit computes said interpolation value at a third point of time corresponding to said predetermined phase of said second clock signal from two values obtained by consecutively sampling said predetermined signal at a first point of time and a second point of time by linear interpolation.

2. A playback method comprising the steps of:

computing an interpolation value of a predetermined signal at a predetermined phase of a second clock signal from values obtained by sampling said predetermined signal in synchronization with a first clock signal;

computing a phase error of said interpolation value; and generating said second clock signal by adjusting the clock frequency thereof in accordance with said phase error, said playback method characterized in that said interpolation value is computed at a third point of time corresponding to said predetermined phase of said second clock signal from two values obtained by consecutively sampling said predetermined signal at a first point of time and a second point of time by linear interpolation based on a relation between said first, second and third points of time.

3. A playback apparatus comprising:

an interpolation value computing unit for computing an interpolation value of a predetermined signal at a predetermined phase of a second clock signal from values obtained by sampling said predetermined signal in synchronization with a first clock signal;

a phase error computing unit for computing a phase error of said interpolation value; and a clock signal generating unit for generating said second clock signal by adjusting the clock frequency thereof in accordance with said phase error in synchronization with said first clock signal, said playback apparatus characterized in that said clock-signal generating unit computes a sum of a value of said second clock signal computed previously and a first constant and then:

either uses said sum as an updated value of said second clock signal if said sum is equal to or smaller than a second constant; or subtracts said second constant from said sum and uses a subtraction result as an updated value of said second clock signal if said sum is greater than said second constant.

4. A playback method comprising the steps of:

computing an interpolation value of a predetermined signal at a predetermined phase of a second clock signal from values obtained by sampling said predetermined signal in synchronization with a first clock signal;

computing a phase error of said interpolation value; and generating said second clock signal by adjusting the clock frequency thereof in accordance with said phase error in synchronization with said first clock signal, said playback method characterized in that a sum of a value of said second clock signal computed previously and a first constant is computed and:

either said sum is used as an updated value of said second clock signal if said sum is equal to or smaller than a second constant; or said second constant is subtracted from said sum and a subtraction result is used as an updated value of said second clock signal if said sum is greater than said second constant.

\* \* \* \* \*